(12) United States Patent
Mikami (10) Patent No.: US 8,927,179 B2
(45) Date of Patent: Jan. 6, 2015

(54) OPTICAL MEMBER FOR EUV LITHOGRAPHY, AND PROCESS FOR PRODUCTION OF REFLECTIVE LAYER-EQUIPPED SUBSTRATE

(75) Inventor: Masaki Mikami, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 152 days.

(21) Appl. No.: 13/469,161

(22) Filed: May 11, 2012

(65) Prior Publication Data
US 2012/0219890 A1    Aug. 30, 2012

Related U.S. Application Data

(63) Continuation of application No. PCT/JP2010/071738, filed on Dec. 3, 2010.

(30) Foreign Application Priority Data

Dec. 4, 2009 (JP) .................. 2009-276178

(51) Int. Cl.
| | |
|---|---|
| *G03F 1/24* | (2012.01) |
| *G02B 5/08* | (2006.01) |
| *C23C 16/40* | (2006.01) |
| *G03F 7/20* | (2006.01) |
| *B82Y 40/00* | (2011.01) |
| *B82Y 10/00* | (2011.01) |

(52) U.S. Cl.
CPC .............. *G03F 1/24* (2013.01); *G03F 7/70958* (2013.01); *B82Y 40/00* (2013.01); *B82Y 10/00* (2013.01); *G21K 2201/061* (2013.01); *G02B 5/0891* (2013.01)
USPC ..................... 430/4; 430/5; 359/359; 427/532

(58) Field of Classification Search
CPC ........ G03F 1/24; G02B 5/0875; C23C 16/401
USPC .......................... 430/4–5; 359/359; 427/532
See application file for complete search history.

(56) References Cited

U.S. PATENT DOCUMENTS

| 5,928,817 A | 7/1999 | Yan et al. |
|---|---|---|
| 6,410,193 B1 | 6/2002 | Stivers et al. |

(Continued)

FOREIGN PATENT DOCUMENTS

| CN | 1868033 A | 11/2006 |
|---|---|---|
| JP | 2005-268750 | 9/2005 |

(Continued)

OTHER PUBLICATIONS

U.S. Appl. No. 13/727,305, filed Dec. 26, 2012, Mikami, et al.

(Continued)

*Primary Examiner* — Stephen Rosasco
*Assistant Examiner* — John S Ruggles
(74) *Attorney, Agent, or Firm* — Oblon, Spivak, McClelland, Maier & Neustadt L.L.P.

(57) ABSTRACT

There are provided an EUV optical member, in which deterioration in the reflectivity due to oxidation of the Ru protective layer is prevented, a functional film-equipped substrate to be employed for production of the EUV optical member, and a process for producing the functional film-equipped substrate. A reflective layer-equipped substrate for EUV lithography comprising a substrate, and a reflective layer for reflecting EUV light and a protective layer for protecting the reflective layer, formed in this order on the substrate, wherein the reflective layer is a Mo/Si multilayer reflective film, the protective layer is a Ru layer or a Ru compound layer, and an intermediate layer containing from 0.5 to 20 at % of oxygen and from 80 to 99.5 at % of Si is formed between the reflective layer and the protective layer.

20 Claims, 2 Drawing Sheets

(56) References Cited

U.S. PATENT DOCUMENTS

| | | |
|---|---|---|
| 6,479,195 B1 | 11/2002 | Kirchauer et al. |
| 6,506,526 B2 | 1/2003 | Stivers et al. |
| 6,583,068 B2 | 6/2003 | Yan et al. |
| 6,593,037 B1 | 7/2003 | Gabriel et al. |
| 6,593,041 B2 | 7/2003 | Yan |
| 6,596,465 B1 | 7/2003 | Mangat et al. |
| 6,607,862 B2 | 8/2003 | Yan et al. |
| 6,610,447 B2 | 8/2003 | Yan et al. |
| 6,627,362 B2 | 9/2003 | Stivers et al. |
| 6,630,273 B2 | 10/2003 | Yan et al. |
| 6,645,679 B1 | 11/2003 | La Fontaine et al. |
| 6,653,053 B2 | 11/2003 | Mangat et al. |
| 6,699,625 B2 | 3/2004 | Lee et al. |
| 6,720,118 B2 | 4/2004 | Yan et al. |
| 6,797,368 B2 | 9/2004 | Shoki |
| 6,818,357 B2 | 11/2004 | Yan |
| 6,830,851 B2 | 12/2004 | Yan |
| 6,905,801 B2 | 6/2005 | Liang et al. |
| 6,908,713 B2 | 6/2005 | Silverman |
| 6,908,714 B2 | 6/2005 | Yan et al. |
| 6,913,706 B2 | 7/2005 | Yan et al. |
| 6,998,200 B2 | 2/2006 | Lee |
| 7,078,134 B2 | 7/2006 | Wurm et al. |
| 7,090,948 B2 | 8/2006 | Rau |
| 7,118,832 B2 | 10/2006 | Yan |
| 7,172,788 B2 | 2/2007 | Yakshin et al. |
| 7,300,724 B2 | 11/2007 | Yan |
| 7,384,715 B2 | 6/2008 | Lee |
| 7,833,682 B2 | 11/2010 | Hayashi et al. |
| 7,906,259 B2 | 3/2011 | Hayashi et al. |
| 8,088,538 B2 | 1/2012 | Hayashi et al. |
| 2006/0270226 A1 | 11/2006 | Hosoya |
| 2007/0015065 A1* | 1/2007 | Abe et al. ............... 430/5 |
| 2008/0182183 A1* | 7/2008 | Hayashi et al. ............... 430/5 |
| 2009/0277778 A1* | 11/2009 | Stowell et al. ............ 204/192.12 |

FOREIGN PATENT DOCUMENTS

| | | |
|---|---|---|
| JP | 2005-286203 | 10/2005 |
| JP | 2006-170911 | 6/2006 |
| JP | 2006-170916 | 6/2006 |
| JP | 2006-171577 | 6/2006 |
| JP | 2006-173446 | 6/2006 |
| JP | 2006-332153 | 12/2006 |
| JP | 4068285 | 1/2008 |

OTHER PUBLICATIONS

U.S. Appl. No. 13/937,771, filed Jul. 9, 2013, Mikami.
U.S. Appl. No. 13/443,108, filed Apr. 10, 2012, Mikami, et al.
U.S. Appl. No. 13/478,532, filed May 23, 2012, Mikami, et al.
U.S. Appl. No. 13/472,002, filed May 15, 2012, Mikami.
International Search Report issued Mar. 15, 2011 in PCT/JP2010/071738 filed Dec. 3, 2010.

* cited by examiner

OPTICAL MEMBER FOR EUV LITHOGRAPHY, AND PROCESS FOR PRODUCTION OF REFLECTIVE LAYER-EQUIPPED SUBSTRATE

TECHNICAL FIELD

The present invention relates to an optical member for EUV (Extreme Ultraviolet: hereinafter referred to as "EUV") used for, e.g. the production of semiconductors, specifically, a reflective layer-equipped substrate for lithography (hereinafter referred to as "reflective layer-equipped substrate for EUV lithography" or simply "reflective layer-equipped substrate" in this specification), a reflective mask blank for EUV lithography, (hereinafter referred to as "EUV mask blank" in this specification), a reflective mask for EUV lithography obtainable by patterning the EUV mask blank (hereinafter referred to as "EUV mask" in this specification), and a reflective mirror for EUV lithography (hereinafter referred to as "EUV mirror" in this specification) (hereinafter collectively also referred to as "optical member for EUV lithography" in this specification); and a process for production of a reflective layer-equipped substrate for EUV lithography.

BACKGROUND ART

Heretofore, in the semiconductor industry, a photolithography method employing visible light or ultraviolet light has been used as a technique to transfer a fine pattern required to form an integrated circuit with a fine pattern on e.g. a silicon substrate. However, the conventional photolithography method has come close to its limit, while miniaturization of semiconductor devices is being accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF laser (193 nm) is employed, about 45 nm is presumed to be the limit. Under the circumstances, as an exposure technique for the next generation employing an exposure wavelength shorter than 45 nm, EUV lithography is expected to be prospective, which is an exposure technique employing EUV light having a wavelength further shorter than ArF laser. In this specification, EUV light is meant for light a ray having a wavelength within a soft X-ray region or within a vacuum ultraviolet region, specifically for a light ray having a wavelength of from about 10 to 20 nm, particularly about 13.5 nm±0.3 nm.

EUV light is likely to be absorbed by all kinds of substances, and the refractive index of substances at such a wavelength is close to 1, whereby it is not possible to use a conventional refracting optical system like photolithography employing visible light or ultraviolet light. Therefore, in EUV lithography, a reflective optical system, i.e. a reflective photomask and reflective mirror, is employed.

A mask blank is a laminate before pattering, to be used for the production of a photomask. In the case of an EUV mask blank, it has a structure wherein a reflective layer to reflect EUV light and an absorber layer to absorb EUV light, are formed in this order on a substrate made of e.g. glass. As the reflective layer, it is common to use a Mo/Si multilayer reflective film having a molybdenum (Mo) layer as a high refractive index layer and a silicon (Si) layer as a low refractive index layer alternately laminated to have the light reflectivity improved when the layer surface is irradiated with EUV light.

For the absorber layer, a material having a high absorption coefficient to EUV light, specifically e.g. a material containing chromium (Cr) or tantalum (Ta) as the main component, is used.

Usually, a protective layer is formed between the above-described reflective layer and the absorber layer. Such a protective layer is one to be provided for the purpose of protecting the reflective layer, so that the reflective layer will not be damaged by an etching process to be carried out for the purpose of forming a pattern on the absorber layer. In Patent Document 1, it is proposed to use ruthenium (Ru) as the material for the protective layer. In Patent Document 2, a protective layer is proposed which is made of a ruthenium compound (Ru content: 10 to 95 at %) containing Ru and at least one member selected from Mo, Nb, Zr, Y, B, Ti and La.

A mirror to be used for EUV lithography has a structure wherein a reflective layer for reflecting EUV light is formed on a substrate made of e.g. glass. As the reflective layer, a multilayer reflective film having high refractive index layers and low refractive index layers alternately laminated plural times is usually used, since a high EUV light reflectivity can be thereby accomplished. Therefore, as a mirror to be used for EUV lithography, such a multilayer mirror having a multilayer reflective film formed on a substrate is usually employed (Patent Document 3).

In such a multilayer mirror, a protective layer (a protective capping layer) is formed on such a multilayer reflective film for the purpose of protecting the multilayer reflective film from chemical or physical erosion in many cases. Patent Document 3 discloses that an EUV mirror is configured such that a specific capping layer (protective layer) is formed on a reflective layer for the purpose of having resistance to chemical or physical erosion. The multilayer mirror disclosed in Patent Document 3 is provided with a protective capping layer made of a material selected from ruthenium (Ru) and rhodium (Rh), and their compounds and alloys.

PRIOR ART DOCUMENTS

Patent Documents

Patent Document 1: JP-A-2002-122981 (U.S. Pat. No. 6,699,625)
Patent Document 2: JP-A-2005-268750
Patent Document 3: Japanese Patent No. 4,068,285 (EP-A-1065568)

DISCLOSURE OF INVENTION

Technical Problem

In a case where Ru is employed as the material for the protective layer, a high etching selectivity can be obtained to the absorber layer. Even in a case where the protective layer is formed on the reflective layer, a high reflectivity is obtainable when the protective layer surface is irradiated with EUV light.

However, in a case where Ru is employed as the material for the protective layer, there is a problem such that the EUV light reflectivity at the time when the protective layer surface is irradiated with EUV light decreases, since the Ru protective layer and further, the uppermost layer of the multilayer reflective film (the Si layer in the case of the Mo/Si multilayer reflective film) are oxidized in a step for producing a mask blank or a mirror or a step for producing a photomask from such a mask blank (such as in each of cleaning, defect inspection, heating, dry etching and defect correction) or during such EUV exposure.

Especially, deterioration of the EUV light reflectivity during the EUV exposure progresses as the time passes, thus leading to such a problem that it is required to change the exposure conditions in a half way with the result that the useful life of the photomask or the mirror tends to be short.

Hereinafter, in this specification, deterioration of the EUV light reflectivity at the time when the protective layer surface is irradiated with EUV light, due to oxidation of the Ru protective layer and further the uppermost layer of the multilayer reflective film in a step for producing the mask blank or the mirror or a step for producing a photomask from the mask blank (e.g. washing, defect inspection, heating, dry etching and defect repair steps, etc.) or during such EUV exposure, may be referred to simply as "deterioration in the EUV light reflectivity due to oxidation of the Ru protective layer".

The protective layer as disclosed in Patent Document 2 is to bring about no deterioration in the reflectivity of the multilayer reflective film and yet to provide a sufficient effect to prevent oxidation of the multilayer reflective film. However, as is apparent from the disclosure in paragraph [0006] in this document, the deterioration in the reflectivity of the multilayer reflective film mentioned here means that by e.g. heat treatment during the formation of the Ru protective layer or subsequent heat treatment, the Ru protective layer and the Si layer as the upper layer of the multilayer reflective film are likely to form a diffused layer, whereby the reflectivity is likely to be deteriorated, but there is no mention about deterioration in the EUV light reflectivity due to oxidation of the Ru protective layer as described above.

From the above-described viewpoint, it is an object of the present invention to provide an optical member, such as a reflective layer-equipped substrate for EUV lithography, an EUV mask blank, an EUV mask and an EUV mirror, in which deterioration in the EUV light reflectivity due to oxidation of the Ru protective layer is prevented, and a process for production of such a reflective layer-equipped substrate.

Solution to Problem

The present inventor has conducted an extensive study to solve the above-described problem and as a result, have found it possible to suppress the deterioration of the EUV light reflectivity due to oxidation of the Ru protective layer by forming an intermediate layer containing Si and O in prescribed amounts, between the Mo/Si multilayer reflective film and the Ru protective layer.

The present invention has been made based on the above-described discovery by the present inventor and provides a reflective layer-equipped substrate for EUV lithography (hereinafter also referred to as "the reflective layer-equipped substrate of the present invention" in this specification) comprising a substrate, and a reflective layer for reflecting EUV light and a protective layer for protecting the reflective layer, formed in this order on the substrate, wherein the reflective layer is a Mo/Si multilayer reflective film, the protective layer is a Ru layer or a Ru compound layer, and an intermediate layer containing from 0.5 to 20 at % of oxygen and from 80 to 99.5 at % of Si is formed between the reflective layer and the protective layer.

In the present invention, it is preferred that the uppermost layer of the reflective layer made of a Mo/Si multilayer reflective film is a Si film, and the intermediate layer is formed on the surface of the Si film.

In the reflective layer-equipped substrate of the present invention, it is preferred that the thickness of the intermediate layer is from 0.2 to 2.5 nm.

In the reflective layer-equipped substrate of the present invention, it is preferred that the surface roughness rms of the surface of the protective layer is at most 0.5 nm.

In the reflective layer-equipped substrate of the present invention, it is preferred that the thickness of the protective layer is from 1 to 10 nm.

Further, the present invention provides a reflective mask blank for EUV lithography (hereinafter referred to also as an "EUV mask blank of the present invention") having an absorber layer formed on the protective layer of the above-described reflective layer-equipped substrate of the present invention.

In the EUV mask blank of the present invention, it is preferred that the absorber layer is made of a material containing tantalum (Ta) as the main component.

In the EUV mask blank of the present invention, it is preferred that the etching selectivity between the protective layer and the absorber layer when subjected to dry etching using a chlorine-type gas as the etching gas, is at least 10.

In the EUV mask blank of the present invention, it is preferred that a low reflective layer to an inspection light to be used for inspection of a mask pattern, made of a material containing tantalum (Ta) as the main component, is formed on the absorber layer.

In the case where a low reflective layer is formed on the absorber layer, it is preferred that the contrast between reflected light on the surface of the protective layer and reflected light on the surface of the low reflective layer, to the wavelength of light to be used for inspection of a pattern formed in the absorber layer, is at least 30%.

Further, the present invention provides a reflective mask for EUV lithography (hereinafter referred to also as an "EUV mask of the present invention") obtained by patterning the above-described EUV mask blank of the present invention.

Further, the present invention provides a reflective mirror for EUV lithography employing the above-described reflective layer-equipped substrate for EUV lithography of the present invention (hereinafter, referred to as "EUV mirror of the present invention)".

Further, the present invention provides a process for producing a reflective layer-equipped substrate for EUV lithography (EUVL), which comprises forming a multilayer reflective film for reflecting EUV light on a film-forming surface of a substrate and then, forming a protective layer for protecting the multilayer reflective film, on the multilayer reflective film, to produce a reflective layer-equipped substrate for EUVL, wherein the multilayer reflective film is a Mo/Si multilayer reflective film, the protective layer is a Ru layer or a Ru compound layer, and after forming the Mo/Si multilayer reflective film, the surface of a Si film as the uppermost layer of the Mo/Si multilayer reflective film is exposed to an oxygen-containing atmosphere, and then, the protective layer is formed.

In the process for producing the reflective layer-equipped substrate for EUVL of the present invention, it is preferred that the product of the oxygen partial pressure (Torr) of the oxygen-containing atmosphere and the exposure time (s) is at least $1 \times 10^{-6}$ Torr·s (=1 L (Langmuir)), and the temperature of the oxygen-containing atmosphere is from 0 to 150° C.

In the process for producing the reflective layer-equipped substrate of the present invention, it is preferred that when the surface of the Si layer as the uppermost layer of the Mo/Si multilayer reflective film is exposed to the oxygen-containing atmosphere after formation of the uppermost layer of the Mo/Si multilayer reflective film, the oxygen-containing atmosphere is maintained to be in a plasma state, or the surface of the Si layer is subjected to thermal treatment, or the surface of the Si layer is irradiated with an ultraviolet ray.

Advantageous Effects of Invention

In the reflective layer-equipped substrate of the present invention and the EUV mask blank or the EUV mirror employing the reflective layer-equipped substrate, deterioration in the EUV light reflectivity due to oxidation of the Ru protective layer is prevented. And, by prevention of the progress with time of deterioration in the EUV light reflectivity during the EUV exposure, it becomes unnecessary to change the exposure conditions in a half way, and it is possible to prolong the useful life of the EUV mask or EUV mirror.

Further, the EUV mask prepared by employing the EUV mask blank of the present invention, is a highly reliable EUV mask, whereby a change with time of the EUV light reflectivity is little during the EUV exposure.

DESCRIPTION OF EMBODIMENTS

Now, the present invention will be described with reference to the drawing.

Figure 1:
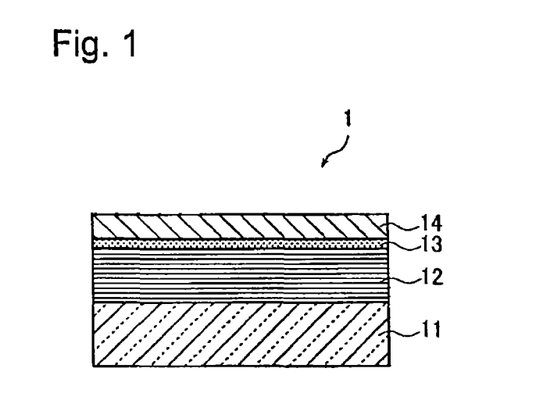
FIG. 1 is a schematic cross-sectional view illustrating an embodiment of the EUV mask blank of the present invention.

FIG. 1 is a schematic cross-sectional view illustrating an embodiment of the EUV mask blank of the present invention. An EUV mask blank 1 shown in FIG. 1 has a reflective layer 12 for reflecting EUV light and a protective layer 14 for protecting the reflective layer 12, formed in this order on a substrate 11. The EUV mask blank of the present invention is characterized in that an intermediate layer 13 containing the after-described prescribed amounts of oxygen and Si, is formed between the reflective layer 12 and the protective layer 14. The protective layer has an absorber layer 15 formed thereon.

Figure 4:
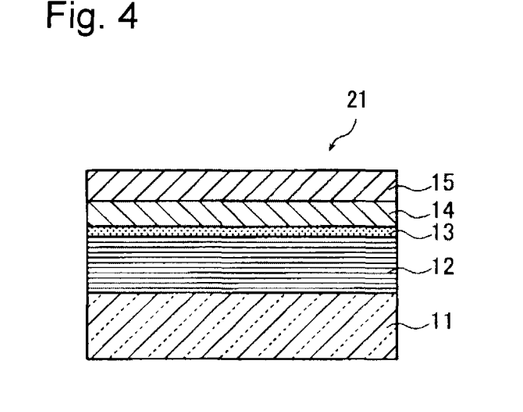
FIG. 4 is a schematic cross-sectional view illustrating an embodiment of the EUV mirror of the present invention.

FIG. 4 is a schematic cross-sectional view illustrating an embodiment of the EUV mirror of the present invention. An EUV mirror 21 shown in FIG. 4 has a reflective layer 12 for reflecting EUV light, a protective layer 14 for protecting the reflective layer 12 and an absorber layer 15 formed in this order on a substrate 11. The multilayer mirror for EUVL of the present invention is characterized in that the after-described intermediate layer 13 is formed between the reflective layer 12 and the protective layer 14.

Hereinafter, the respective elements constituting the mask blank 1 and the mirror 21 will be described. It should be noted that a member having a multilayer film for reflecting EUV light, such as the mask blank and the mirror, is also called "EUV optical member".

It is important that the substrate 11 satisfies the properties as a substrate for an EUV optical member. Therefore, it is important that the substrate 11 has a low thermal expansion coefficient. Specifically, the thermal expansion coefficient of the substrate 11 is preferably $0\pm1.0\times10^{-7}/°$ C., more preferably $0\pm0.3\times10^{7}/°$ C., further preferably $0\pm0.2\times10^{-7}/°$ C., further preferably $0\pm0.1\times10^{-7}/°$ C., particularly preferably $0\pm0.05\times10^{-7}/°$ C. Further, the substrate preferably has a smoothness and a planarity, and is excellent in durability against a cleaning liquid to be used for e.g. cleaning of a mask blank or a photomask after patterning. As the substrate 11, specifically, a glass having a low thermal expansion coefficient, e.g. a $SiO_2$—$TiO_2$ type glass, may be used. However, the substrate is not limited thereto, and it is possible to employ a substrate of, e.g. crystallized glass having β-quartz solid solution precipitated, quartz glass, silicon, or a metal. Further, a film, such as a stress correcting film, may be formed on the substrate 11.

The substrate 11 preferably has a smooth surface having a surface roughness rms of at most 0.15 nm and a planarity of at most 100 nm, whereby a high reflectivity and transfer precision can be attained by a photomask after forming a pattern.

The size, thickness, etc. of the substrate 11 are suitably determined depending upon e.g. the designed values for the mask. In Examples given hereinafter, a $SiO_2$—$TiO_2$ type glass having a size of 6 inch (152.4 mm) square and a thickness of 0.25 inch (6.3 mm) was used. The size of the substrate to be used for the mirror is optionally determined depending upon, e.g. the design values for an exposure tool, and a substrate having a diameter of about 50 to 500 mm is usually used.

The substrate for the mask blank has a planar shape in a rectangular form, such as a square form. On the other hand, the substrate for the mirror has a planar shape in a circular, elliptical or polygonal form in many cases.

It is preferred that no defect is present on the surface of the substrate 11 on the side where a multilayer type reflective layer 12 is to be formed. However, even in a case where a defect is present, in order not to cause a phase defect due to a concave defect and/or a convex defect, it is preferred that the depth of a concave defect or the height of a convex defect is not more than 2 nm, and the half value width of such a concave defect or convex defect is not more than 60 nm.

The property particularly required for the reflective layer 12 of the EUV optical member is a high EUV light reflectivity. Specifically, when a light ray within an EUV wavelength region is applied at an incident angle of 6° to the surface of the reflective layer 12, the maximum value of the reflectivity of the light ray in the vicinity of a wavelength of 13.5 nm is preferably at least 60%, more preferably at least 65%. Further, even in a case where an intermediate layer 13 and a protective layer 14 are formed on the reflective layer 12, the maximum value of the reflectivity of a light ray in the vicinity of a wavelength of 13.5 nm is preferably at least 60%, more preferably at least 65%.

As a reflective layer, a multilayer reflective film having a high refractive index layer and a low refractive index layer alternately laminated plural times is widely used, since a high reflectivity can thereby be accomplished in the EUV wavelength region. The EUV optical member of the present invention may include a Mo/Si multilayer reflective film having a Mo film as a high refractive index layer and a Si film as a low refractive index layer alternately laminated plural times. In such a Mo/Si multilayer reflective film, it is preferred that the Mo film forms the first layer in contact with the substrate 11 and that the uppermost layer of the laminated Mo/Si multilayer reflective film is made to be a Si film.

In the case of the Mo/Si multilayer reflective film, in order to obtain a reflective layer 12 having the maximum value of the EUV light reflectivity being at least 60%, a Mo layer having a thickness of 2.3±0.1 nm and a Si film having a thickness of 4.5±0.1 nm may be laminated repeatedly so that the number of repeating units becomes from 30 to 60.

Here, each layer constituting the Mo/Si multilayer reflective film may be formed to have a desired thickness by means of a well-known film-forming method, such as a magnetron sputtering method or an ion beam sputtering method. For example, in the case of forming a Mo/Si multilayer reflective film by means of an ion beam sputtering method, it is preferred that a Mo layer is formed on the substrate to have a thickness of 2.3 nm at an ion accelerating voltage of from 300 to 1,500 V and a film-deposition rate of 0.03 to 0.30 nm/sec by using a Mo target as the target and an Ar gas (gas pressure: $1.3 \times 10^{-2}$ Pa to $2.7 \times 10^{-2}$ Pa) as the sputtering gas, and then a Si layer is formed to have a thickness of 4.5 nm at an ion accelerating voltage of from 300 to 1,500 V and a film-deposition rate of from 0.03 to 0.30 nm/sec by using a Si target as the target and an Ar gas (gas pressure: $1.3 \times 10^{-2}$ Pa to $2.7 \times 10^{-2}$ Pa) as the sputtering gas. When this operation is taken as one cycle, the Mo/Si multilayer reflective film is formed by laminating the Mo layer and the Si layer by from 40 to 50 cycles.

In the EUV optical member of the present invention, deterioration in the EUV light reflectivity due to oxidation of the Ru protective layer is prevented by forming an intermediate layer 13 containing from 0.5 to 20 at % of oxygen and from 80 to 99.5 at % of Si, between the reflective layer 12 and the protective layer 14. The reason as to why deterioration in the EUV light reflectivity due to oxidation of the Ru protective layer is prevented by forming the intermediate layer 13 having the above-described composition between the reflective layer 12 and the protective layer 14, is considered to be as follows.

By preliminarily incorporating oxygen to the intermediate layer 13 in order to prevent deterioration in reflectivity due to inclusion of a large amount of oxygen by oxidation of the Ru protective layer in the Si film as the uppermost layer of the reflective layer 12, the intermediate layer 13 having the above-described composition is considered to have an effect to prevent oxidation and to secure a high reflectivity after the film formation. Thus, even in a situation where the Ru protective layer is likely to be oxidized in (1) a step to be carried out during the production of the optical member or (2) a step to be carried out during the production of a photomask from a mask blank (such as in each step of cleaning, defect inspection, heating, dry etching, defect correction), or (3) during EUV exposure, by the presence of the intermediate layer 13 having the effect to prevent further oxidation, oxidation of the Mo/Si multilayer reflective film present beneath the intermediate layer 13, more specifically, oxidation of the Si film as the uppermost layer of the Mo/Si multilayer reflective film, is considered to be prevented, and as a result, deterioration in the EUV light reflectivity due to oxidation of the Ru protective layer, is considered to be prevented.

Here, by forming the intermediate layer 13 between the reflective layer 12 (Mo/Si multilayer reflective film) and the protective layer 14 (Ru protective layer), it is also possible to prevent diffusion of Si in the Si film as the uppermost layer of the Mo/Si multilayer reflective film into the Ru protective layer during the formation of the protective layer 14.

If the content of oxygen in the intermediate layer 13 is less than 0.5 at %, it is likely that the above-described effect to prevent further oxidation tends to be inadequate, whereby it is likely that the effect to prevent deterioration in the EUV light reflectivity due to oxidation of the Ru protective layer tends to be inadequate.

As described in detail hereinafter, in the present invention, the intermediate layer 13 having the above-described composition can be formed in such a manner that after forming the Mo/Si multilayer reflective film, the surface of the Si film as the uppermost layer of the Mo/Si multilayer reflective film is exposed to an oxygen-containing atmosphere. However, in a case where the content of oxygen in the intermediate layer 13 exceeds 20 at %, oxygen is considered to be incorporated either during the film formation of the Si film as the uppermost layer of the Mo/Si multilayer reflective film, or during the film formation of the protective layer 14 to be formed on the intermediate layer 13 or during the film formation of both, but the film having the oxygen thus incorporated is likely to have defects increased during the film formation, thus leading to a problem.

The intermediate layer 13 contains preferably from 0.5 to 15 at % of oxygen and from 85 to 99.5 at % of Si, more preferably from 0.5 to 10 at % of oxygen and from 80 to 99.5 at % of Si, further preferably from 2 to 8 at % of oxygen and from 92 to 98 at % of Si, further preferably from 3 to 7 at % of oxygen and from 93 to 97 at % of Si, particularly preferably from 4 to 6 at % of oxygen and from 94 to 96 at % of Si.

The intermediate layer 13 preferably contains no fluorine, since otherwise, Si in the intermediate layer 13 is likely to be eroded. Further, the intermediate layer 13 preferably contains no carbon or hydrogen, since if carbon or hydrogen is contained in the intermediate layer 13, it is likely to react with oxygen in the intermediate layer 13, whereby oxygen in the intermediate layer 13 is discharged. For these reasons, the contents of fluorine, carbon and hydrogen in the intermediate layer 13 are preferably at most 3 at %, more preferably at most 1 at %, respectively.

The thickness of the intermediate layer 13 is preferably from 0.2 to 2.5 nm, more preferably from 0.4 to 2.0 nm, further preferably from 0.5 to 1.5 nm, from the viewpoint of the effect to prevent deterioration in the EUV light reflectivity due to oxidation of the Ru protective layer.

After forming the Mo/Si multilayer reflective film, the intermediate layer 13 can be formed by exposing the surface of the Si film as the uppermost layer of the Mo/Si multilayer reflective film to an oxygen-containing atmosphere, thereby to slightly oxidize the surface of the Si film.

It should be noted that the oxidation of the surface of the Si film leads to no deterioration in EUV light reflectivity since the oxidation of the surface of the Si film due to exposure to the oxygen-containing atmosphere is minor.

In other words, the deterioration in EUV light reflectivity due to the above-described oxidization of the Ru protective layer is caused by being significantly oxidized since the Ru protective layer and the Si film as the uppermost layer of the Mo/Si multilayer reflective film are placed in a state to be highly likely to be oxidized during the production of the optical member, during the production of a photomask or during EUV exposure. Specific examples of the above-described state where these layers are highly to be oxidized include (1) laser irradiation or electron beam irradiation carried out during defect inspection, ion beam irradiation which is carried out for the purpose of correcting a defect in the Ru protective layer or the Mo/Si multilayer film beneath the Ru protective layer, or high-energy ray irradiation, such as irradiation with EUV light during EUV exposure; (2) a dry etching process carried out for the purpose of patterning the absorber layer, cleaning by means of ozone having a strong oxidation effect, pre-bake carried out during the production of a photomask or a step of heating an object to at least 150° C., such as in post-bake; and (3) oxidation treatment for removing carbide on the surface of a photomask after the photomask is produced.

In the contrast, since the procedure for exposing the surface of the Si film to the oxygen-containing atmosphere is carried out in a relatively low temperature circumstance as described hereinafter, the oxidation of the surface of the Si film due to exposure to the oxygen-containing atmosphere is minor and does not lead to problematic deterioration in the EUV light reflectivity.

In the present invention, the oxygen-containing atmosphere to which the Si film surface is exposed, is preferably such that the product of the oxygen partial pressure (Torr) and the exposure time (s) is preferably at least $1 \times 10^{-6}$ Torr·s (=1 L (Langmuir)). The product of the oxygen partial pressure and the exposure time is an index showing a frequency of impingement of oxygen in the oxygen-containing atmosphere to the Si film surface, and in this specification, it may sometimes be referred to as "exposure amount of oxygen". In order to form the intermediate layer 13 having the above-described composition by oxidizing of the Si film layer surface, such a value is preferably at least $1 \times 10^{-6}$ Torr·s, more preferably at least $1 \times 10^{-3}$ Torr·s, further preferably at least $1 \times 10^{-2}$ Torr·s, further preferably at least $1 \times 10^{-1}$ Torr·s.

As the procedure for exposing the Si film surface to the oxygen-containing atmosphere, like the procedures shown in Examples 1 and 4, a procedure for exposing the Si film surface to the atmospheric air may be carried out. Or, as shown in Examples 2, 3 and 5, a procedure for exposing in a reduced-pressure atmosphere the Si film surface to an oxygen gas (a mixed gas of an oxygen gas with an inert gas, such as argon, is also applicable). The procedure for exposing the Si film surface to the atmospheric air is preferred from the viewpoint that operation is simple and no special device is required. On the other hand, the procedure for exposing in a reduced-pressure atmosphere the Si film surface to an oxygen gas is preferably such that in a case where the film forming of the multilayer reflective film and the film forming of the protective layer are carried out in the same chamber, it is important to evacuate the oxygen gas after carrying out the procedure for exposing the Si film surface to the oxygen gas and before carrying out the film formation of the protective layer. Further, this procedure is preferred also in that it is possible to control the oxygen content in the intermediate layer 13 by controlling the exposure amount of the oxygen gas to the Si film surface. In a case where the Si film surface is exposed in a reduced-pressure atmosphere to an oxygen gas or a mixed gas of an oxygen gas with an inert gas, such as argon, it is preferred to irradiate the Si film surface with an ultraviolet ray as shown in the reduced-pressure atmosphere Example 3 from the viewpoint of acceleration of oxidation of the Si film surface.

As long as the oxygen-containing atmosphere to that the Si film surface is exposed meets the above-described conditions, the procedure for exposing the Si film surface to the oxygen-containing atmosphere is limited to no specific one. However, the procedure for exposing in a reduced-pressure atmosphere the Si film surface to an oxygen gas or a mixed gas of an oxygen gas with an inert gas, such as argon, as shown in Examples 2, 3 and 5, is a preferred procedure, taking into consideration that in a case where the film forming of the multilayer reflective film and the film forming of the protective layer are carried out in the same chamber, it is necessary to evacuate the oxygen gas or the mixed gas of an oxygen gas with an inert gas, such as argon, in the chamber after carrying out the procedure for exposing the Si film surface to the oxygen gas (or the mixed gas of an oxygen gas with an inert gas, such as argon) and before carrying out the film formation of the protective layer. Further, this procedure is preferred also in that it is possible to control the oxygen content in the intermediate layer 13 by controlling the exposure amount of the oxygen gas (or the mixed gas of an oxygen gas with an inert gas, such as argon) to the Si film surface.

It is preferred that in the case of exposing in the reduced pressure atmosphere the Si film surface to the oxygen gas or the mixed gas of an oxygen gas with an inert gas, such as argon, the reduced pressure atmosphere is maintained in a plasma state in order to accelerate the oxidation of the Si film surface as in the procedure shown in Example 2. However, even in such a case, if the Si film surface is ion-irradiated with an oxygen gas (or a mixed gas of an oxygen gas with an inert gas, such as argon) ionized in a plasma state by application of a voltage, ionized oxygen is likely to impinge on the Si film surface in an accelerated state, whereby the oxidation of the Si film is likely to proceed excessively to cause deterioration in the EUV light reflectivity of the Mo/Si multilayer reflective film. Therefore, it is particularly preferred not to apply a voltage to the oxygen gas (or the mixed gas of an oxygen gas with an inert gas, such as argon) ionized in a plasma state, i.e. not to apply ion-irradiation, so that it is possible to control the amount of oxygen in the intermediate layer 13 to be at a proper level.

In the present invention, the temperature of the oxygen-containing atmosphere to which the Si film surface is exposed, is preferably from 0 to 150° C. If the temperature of the oxygen-containing atmosphere is less than 0° C., a problem of an influence due to adsorption of the residual moisture in vacuum is likely to occur. If the temperature of the oxygen-containing atmosphere exceeds 150° C., it is likely that oxidation of the Si film proceeds excessively, thus leading to deterioration in the EUV light reflectivity of the Mo/Si multilayer reflective film.

The temperature of the oxygen-containing atmosphere is more preferably from 10 to 140° C., further preferably from 20 to 120° C.

It should be noted that when the Si film surface is irradiated with an ultraviolet ray in a reduced pressure atmosphere, the temperature of the oxygen-containing atmosphere is preferably at most 50° C. to accelerate the oxidation of the Si film surface.

Even when the reduced atmosphere is maintained in a plasma state, the temperature of the oxygen-containing atmosphere is preferably at most 50° C. to accelerate the oxidation of the Si film surface.

In Examples 1 to 5 given hereinafter, the time for exposing the Si film surface to the oxygen-containing atmosphere is set to be 10 min (600 sec), respectively, but the time for exposing the Si film surface to the oxygen-containing atmosphere is not limited thereto and may suitably be selected within a range to satisfy the above-described conditions relating to the oxygen-containing atmosphere.

The protective layer 14 is provided for the purpose of protecting the reflective layer 12, so that at the time of forming a pattern in the absorber layer 15 by an etching process, usually, by a dry etching process, the reflective layer 12 will not be damaged by the etching process. Accordingly, as the material for the protective layer 14, a material hardly susceptible to an influence by the etching process of the absorber layer 15 i.e. having an etching rate slower than the absorber layer 15 and hardly susceptible to damage by such an etching process, is selected for use.

Further, the protective layer 14 is preferably configured such that the protective layer 14 itself also has a high EUV light reflectivity in order not to impair the EUV light reflectivity at the reflective layer 12 even after forming the protective layer 14.

In the present invention, in order to satisfy the above-described conditions, as the protective layer 14, a Ru layer or a Ru compound layer may be formed. As such a Ru compound in the above-described Ru compound, at least one member selected from the group consisting of RuB, RuZr, RuSi and RuNb is preferred. In a case where the protective layer 14 is a Ru compound layer, the content of Ru is preferably at least 50 at %, more preferably at least 80 at %, particularly preferably at least 90 at %. In a case where the protective layer 14 is a RuNb layer, the content of Nb in the protective layer 14 is preferably from 10 to 40 at % from the viewpoint of preventing deterioration of the EUV reflectivity.

In the present invention, the surface roughness rms of the surface of the protective layer 14 is preferably at most 0.5 nm. If the surface roughness of the surface of the protective layer 14 is large, the surface roughness of the absorber layer 15 to be formed on the protective layer 14 tends to be large, whereby the edge roughness of a pattern to be formed in the absorber layer 15 tends to be large, and the dimensional precision of the pattern tends to be poor. As the pattern becomes fine, the influence of the edge roughness becomes distinct, and therefore, it is important that the surface of the absorber layer 15 is smooth.

When the surface roughness rms of the surface of the protective layer 14 is at most 0.5 nm, the surface of the absorber layer 15 to be formed on the protective layer 14 will be sufficiently smooth, thus being free from deterioration of the dimensional precision of a pattern due to an influence of the edge roughness. The surface roughness rms of the surface of the protective layer 14 is more preferably at most 0.4 nm, further preferably at most 0.3 nm.

The thickness of the protective layer 14 is preferably from 1 to 10 nm, whereby the EUV light reflectivity can be increased and an etching resistant characteristic can be obtained. The thickness of the protective layer 14 is more preferably from 1 to 5 nm, further preferably from 2 to 4 nm.

The protective layer 14 may be formed by means of a well-known film forming method, such as a magnetron sputtering method or an ion beam sputtering method.

In a case where a Ru layer is formed as the protective layer 14 by means of a magnetron sputtering method, discharge may be made in an argon (Ar) atmosphere by using a Ru target as the target. Specifically, the magnetron sputtering may be carried out under the following conditions.

Sputtering gas: Ar (gas pressure: from $1.0 \times 10^{-1}$ to $10 \times 10^{-1}$ Pa, preferably from $1.0 \times 10^{-1}$ to $5.0 \times 10^{-1}$ Pa, more preferably from $1.0 \times 10^{-1}$ to $3.0 \times 10^{-1}$ Pa)

Applied power (for each target): from 30 to 1,000 W, preferably from 50 to 750 W, more preferably from 80 to 500 W Film forming rate: from 0.1 to 6 nm/sec, preferably from 0.1 to 4.5 nm/sec, more preferably from 0.1 to 3 nm/sec Further, a state before forming an absorber layer of the EUV mask blank of the present invention, i.e. a structure excluding the absorber layer 15 from the mask blank 1 shown in FIG. 1, is the reflective layer-equipped substrate of the present invention. The reflective layer-equipped substrate of the present invention is also usable as an EUV mirror.

The reflective layer-equipped substrate of the present invention is such that when the surface of the protective layer 14 is cleaned with ozone water in accordance with the procedure described in Examples given hereinafter, deterioration of EUV light reflectivity as between before and after the cleaning is at most 0.9%, more preferably at most 0.5%.

The property particularly required for the absorber layer 15 is that the EUV light reflectivity is very low. Specifically, when the surface of the absorber layer 15 is irradiated with a light ray within a wavelength region of EUV light, the maximum light ray reflectivity in the vicinity of a wavelength of 13.5 nm is preferably at most 0.5%, more preferably at most 0.1%.

In order to attain such a property, it is preferably constituted by a material having a high absorption coefficient of EUV light, and it is preferably formed by a material containing tantalum (Ta) as the main component.

As the absorber layer 15, one containing Ta, B, Si and nitrogen (N) in the following ratio (TaBSiN film) may be mentioned.

Content of B: at least 1 at % and less than 5 at %, preferably from 1 to 4.5 at %, more preferably from 1.5 to 4 at %.

Content of Si: from 1 to 25 at %, preferably from 1 to 20 at %, more preferably from 2 to 12 at %.

Compositional ratio of Ta to N (Ta:N): from 8:1 to 1:1.

Content of Ta: preferably from 50 to 90 at %, more preferably from 60 to 80 at %.

Content of N: preferably from 5 to 30 at %, more preferably from 10 to 25 at %.

The absorber layer 15 as in the above composition is amorphous in its crystal state and is excellent in the surface smoothness.

The absorber layer 15 having the above composition has a surface roughness rms of at most 0.5 nm. If the surface roughness of the surface of the absorber layer 15 is large, the edge roughness of a pattern to be formed in the absorber layer 15 tends to be large, and the dimensional precision of the pattern tends to be poor. As the pattern becomes fine, the influence of the edge roughness becomes distinct, and therefore, it is important that the surface of the absorber layer 15 is smooth.

When the surface roughness rms of the surface of the absorber layer 15 is at most 0.5 nm, the surface of the absorber layer 15 is sufficiently smooth and free from deterioration in the dimensional precision of a pattern due to an influence of the edge roughness. The surface roughness rms of the surface of the absorber layer 15 is more preferably at most 0.4 nm, further preferably at most 0.3 nm.

With the above-described structure, the absorber layer 15 has a high etching rate when dry etching is carried out by using a chlorine-type gas as the etching gas, and the etching selectivity to the protective layer 14 is at least 10. In this specification, the etching selectivity can be calculated by the following formula (1):

$$\text{Etching selectivity} = (\text{etching rate of absorber layer 15})/(\text{etching rate of protective layer 14}) \quad (1)$$

The etching selectivity is preferably at least 10, more preferably at least 11, further preferably at least 12.

The thickness of the absorber layer 15 is preferably from 50 to 100 nm. The absorber layer 15 having the above-described structure can be formed by using a well-known film forming method, e.g. a sputtering method, such as a magnetron sputtering method or an ion beam sputtering method. In a case where a magnetron sputtering method is employed, the absorber layer may be formed by any one of the following methods (1) to (3).

(1) The absorber layer 15 is formed by using a Ta target, a B target and a Si target and simultaneously discharging the respective targets in an atmosphere of nitrogen ($N_2$) diluted with Ar.

(2) The absorber layer 15 is formed by using a TaB compound target and a Si target and simultaneously discharging these targets in an atmosphere of $N_2$ diluted with Ar.

(3) The absorber layer 15 is formed by using a TaBSi compound target and simultaneously discharging, in an atmosphere of $N_2$ diluted with Ar, the target with these three elements integrally combined therein.

It should be noted that in the methods to simultaneously discharging at least two targets ((1) and (2)) among the above-described methods, it is possible to control the composition of the formed absorber layer 15 by controlling the applied power for each target.

Among the above-described methods, methods (2) and (3) are preferred from the viewpoint of preventing destabilization of discharge or variations in the composition of a film or film thickness. Method (3) is particularly preferred. From the viewpoint of preventing destabilization of discharge or variations in the composition of a film or film thickness, it is particularly preferred that the TaBSi compound target has such a composition that Ta is from 50 to 94 at %, Si is from 5 to 30 at % and B is from 1 to 20 at %.

The formation of the absorber layer 15 by the above-exemplified methods may be specifically carried out under the following film forming conditions.

[Method (2) to Use a TaB Compound Target and a Si Target]
  Sputtering gas: mixed gas of Ar and $N_2$ ($N_2$ gas concentration of from 3 to 80 vol %, preferably from 5 to 30 vol %, more preferably from 8 to 15 vol %
  Gas pressure of $1.0 \times 10^{-1}$ Pa to $10 \times 10^{-1}$ Pa, preferably from $1.0 \times 10^{-1}$ Pa to $5 \times 10^{-1}$ Pa, more preferably from $1.0 \times 10^{-1}$ Pa to $3 \times 10^{-1}$ Pa)
  Applied power (for each target): from 30 to 1,000 W, preferably from 50 to 750 W, more preferably from 80 to 500 W
  Film forming rate: from 2.0 to 60 nm/sec, preferably from 3.5 to 45 nm/sec, more preferably from 5 to 30 nm/sec.

[Method (3) to Use a TaBSi Compound Target]
  Sputtering gas: mixed gas of Ar and $N_2$ ($N_2$ gas concentration of from 3 to 80 vol %, preferably from 5 to 30 vol %, more preferably from 8 to 15 vol %
  Gas pressure of $1.0 \times 10^{-1}$ Pa to $10 \times 10^{-1}$ Pa, preferably from $1.0 \times 10^{-1}$ Pa to $5 \times 10^{-1}$ Pa, more preferably from $1.0 \times 10^{-1}$ Pa to $3 \times 10^{-1}$ Pa)
  Applied power: from 30 to 1,000 W, preferably from 50 to 750 W, more preferably from 80 to 500 W
  Film forming rate: from 2.0 to 60 nm/sec, preferably from 3.5 to 45 nm/sec, more preferably from 5 to 30 nm/sec.

Figure 2:
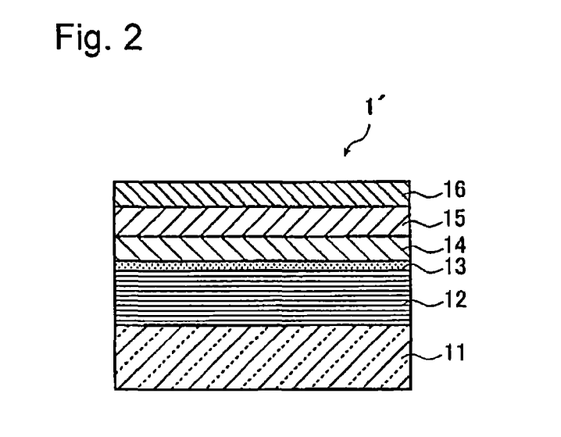
FIG. 2 is a schematic cross-sectional view illustrating an embodiment wherein a low reflective layer is formed on the absorber layer of the EUV mask blank in FIG. 1.

Like the EUV mask blank 1' shown in FIG. 2, the EUV mask blank of the present invention is preferably such that a low reflective layer 16 to an inspection light to be used for inspection of a mask pattern is formed on the absorber layer 15.

At the time of preparing an EUV mask, after forming a pattern in the absorber layer, an inspection is conducted to see if the pattern is formed as designed. In such an inspection of a mask pattern, an inspecting machine is used wherein light having a wavelength of about 257 nm is usually used as the inspection light. That is, the inspection is made by a difference in the reflectivity of such light having a wavelength of about 257 nm, specifically by the difference in the reflectivity between the surface exposed by removal of the absorber layer 15 by the formation of a pattern and the surface of the absorber layer 15 remained without being removed by the formation of the pattern. Here, the former is the surface of the protective layer 14. Therefore, if the difference in the reflectivity between the surface of the protective layer 14 and the surface of the absorber layer 15 to the wavelength of the inspection light is small, the contrast at the time of the inspection becomes poor, and an accurate inspection may not be done.

The absorber layer 15 having the above-described structure has a very low EUV light reflectivity and has an excellent property as an absorber layer for an EUV mask blank, but when viewed with respect to the wavelength of the inspection light, the reflectivity may not be necessarily sufficiently low. As a result, the difference between the reflectivity at the surface of the absorber layer 15 and the reflectivity at the surface of the protective layer 14 at the wavelength of the inspection light tends to be small, and the contrast at the time of the inspection may not sufficiently be obtainable. If the contrast at the time of the inspection cannot be sufficiently obtained, a defect in a pattern cannot sufficiently be detected in the inspection of a mask, and an adequate inspection of a defect may not be carried out.

Like the EUV mask blank 1' shown in FIG. 2, by forming a low reflective layer 16 on the absorber layer 15, the contrast at the time of the inspection will be good. In other words, the reflectivity at a wavelength of the inspection light becomes very low. When irradiated with a light ray within the wavelength region of the inspection light, the low reflective layer 16 to be formed for such a purpose preferably has the maximum reflectivity at the wavelength of the inspection light being at most 15%, more preferably at most 10%, further preferably at most 5%. When the reflectivity at the wavelength of the inspection light at the low reflective layer 16 is at most 15%, the contrast at the time of the inspection is good. Specifically, the contrast between reflected light with a wavelength of the inspection light at the surface of the protective layer 14 and reflected light with the wavelength of the inspection light at the surface of the low reflective layer 16 becomes at least 30%, preferably at least 40%.

In this specification, the contrast can be obtained by using the following formula (2).

$$\text{Contrast}(\%) = ((R_2 - R_1)/(R_2 + R_1)) \times 100 \quad (2)$$

Figure 3:
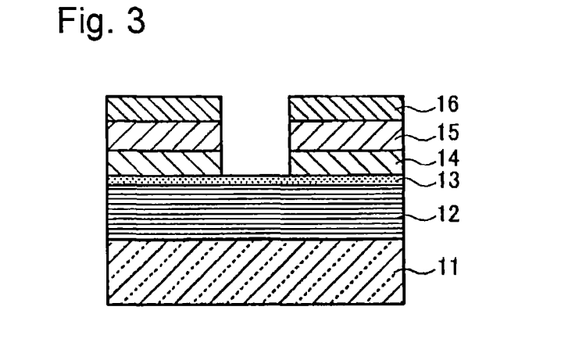
FIG. 3 is a schematic cross-sectional view illustrating an embodiment wherein a pattern is formed in the absorber layer 14 and the low reflective layer 15 of the EUV mask blank 1' in FIG. 2.

Here, $R_2$ at the wavelength of the inspection light is the reflectivity at the surface of the protective layer 14, and $R_1$ is the reflectivity at the surface of the low reflective layer 16. Here, the above $R_1$ and $R_2$ are measured in such a state as shown in FIG. 2 wherein a pattern is formed in the absorber layer 15 and the low reflective layer 16 of the EUV mask blank 1' (i.e. in the state as shown in FIG. 3). The above $R_2$ is a value measured at the surface of the protective layer 14 exposed as the absorber layer 15 and the low reflective layer 16 were removed by formation of a pattern, as shown in FIG. 3, and $R_1$ is a value measured at the surface of the low reflective layer 16 remained without being removed by the formation of the pattern.

In the present invention, the contrast represented by the above formula is more preferably at least 45%, further preferably at least 60%, particularly preferably at least 80%.

To attain the above-described properties, the low reflective layer 16 is preferably constituted by a material having a refractive index lower than the absorber layer 15 at the wavelength of the inspection light, and its crystal state is preferably amorphous.

As a specific example of such a low reflective layer 16, one containing Ta, B, Si and oxygen (O) in the following ratio (low reflective layer (TaBSiO)) may be mentioned.
  Content of B: at least 1 at % and less than 5 at %, preferably from 1 to 4.5 at %, more preferably from 1.5 to 4 at %.
  Content of Si: from 1 to 25 at %, preferably from 1 to 20 at %, more preferably from 2 to 10 at %.
  Compositional ratio of Ta to O (Ta:O): from 7:2 to 1:2, preferably from 7:2 to 1:1, more preferably from 2:1 to 1:1.

Further, as a specific example for the low reflective layer 16, one containing Ta, B, Si, O and N in the following ratio (low reflective layer (TaBSiON)) may be mentioned.

Content of B: at least 1 at % and less than 5 at %, preferably from 1 to 4.5 at %, more preferably from 2 to 4.0 at %.
Content of Si: from 1 to 25 at %, preferably from 1 to 20 at %, more preferably from 2 to 10 at %.
Compositional ratio of Ta to O and N (Ta:(O+N)): from 7:2 to 1:2, preferably from 7:2 to 1:1, more preferably from 2:1 to 1:1.

With the above-described structure, the low reflective layer ((TaBSiO) or (TaBSiON)) is amorphous in its crystal state and is excellent in its surface smoothness. Specifically, the surface roughness rms of the low reflective layer ((TaBSiO) or (TaBSiON)) is preferably at most 0.5 nm.

As mentioned above, in order to prevent deterioration in the dimensional precision of a pattern due to an influence of the edge roughness, it is important that the surface of the absorber layer 15 is smooth. It is also important for the same reason that the surface of the low reflective layer 16 is smooth because of being formed on the absorber layer 15.

When the surface roughness rms of the surface of the low reflective layer 16 is at most 0.5 nm, the surface of the low reflective layer 16 is sufficiently smooth and free from deterioration in the dimensional precision of a pattern due to an influence of the edge roughness. The surface roughness rms of the surface of the low reflective layer 16 is more preferably at most 0.4 nm, further preferably at most 0.3 nm.

In a case where the low reflective layer 16 is formed on the absorber layer 15, the total thickness of the absorber layer 15 and the low reflective layer 16 is preferably from 55 to 130 nm. Further, if the thickness of the low reflective layer 16 is more than the thickness of the absorber layer 15, the EUV absorbing property at the absorber layer 15 is likely to be low, and therefore, the thickness of the low reflective layer 16 is preferably less than the thickness of the absorber layer 15. For this purpose, the thickness of the low reflective layer 16 is preferably from 5 to 30 nm, more preferably from 10 to 20 nm.

The low reflective layer ((TaBSiO) or (TaBSiON)) may be formed by using a well-known film forming method, e.g. a sputtering method, such as a magnetron sputtering method or an ion beam sputtering method. In a case where a magnetron sputtering method is employed, the low reflective layer (TaBSiO) may be formed by any one of the following methods (1) to (3).

(1) The low reflective layer (TaBSiO) is formed by using a Ta target, a B target and a Si target and simultaneously discharging the respective targets in an atmosphere of oxygen ($O_2$) diluted with argon (Ar).

(2) The low reflective layer (TaBSiO) is formed by using a TaB compound target and a Si target and simultaneously discharging these targets in an atmosphere of oxygen diluted with argon.

(3) The low reflective layer (TaBSiO) is formed by using a TaBSi compound target and simultaneously discharging, in an atmosphere of oxygen diluted with argon, the target with these three elements integrally combined therein.

It should be noted that in the methods to simultaneously discharging at least two targets ((1) and (2)) among the above-described methods, it is possible to control the composition of the formed low reflective layer (TaBSiO) by controlling the applied power for each target.

Among the above-described methods, methods (2) and (3) are preferred from the viewpoint of preventing destabilization of discharge or variations in the composition of a film or film thickness. Method (3) is particularly preferred. From the viewpoint of preventing destabilization of discharge or variations in the composition of a film or film thickness, it is particularly preferred that the TaBSi compound target has such a composition that Ta is from 50 to 94 at %, Si is from 5 to 30 at % and B is from 1 to 20 at %.

The formation of the low reflective layer (TaBSiON) may be made by carrying out any one of the above-described procedures in an atmosphere of a mixed gas of oxygen and nitrogen diluted with argon instead of an atmosphere of oxygen diluted with argon.

The formation of the low reflective layer (TaBSiO) by the above-exemplified methods may be specifically carried out under the following film forming conditions.

[Method (2) to Use a TaB Compound Target and a Si Target]
Sputtering gas: mixed gas of Ar and $O_2$ ($O_2$ gas concentration of from 3 to 80 vol %, preferably from 5 to 30 vol %, more preferably from 8 to 15 vol %)
Gas pressure: $1.0 \times 10^{-1}$ Pa to $10 \times 10^{-1}$ Pa, preferably from $1.0 \times 10^{-1}$ Pa to $5 \times 10^{-1}$ Pa, more preferably from $1.0 \times 10^{-1}$ Pa to $3 \times 10^{-1}$ Pa
Applied power (for each target): from 30 to 1,000 W, preferably from 50 to 750 W, more preferably from 80 to 500 W
Film forming rate: from 2.0 to 60 nm/sec, preferably from 3.5 to 45 nm/sec, more preferably from 5 to 30 nm/sec.

[Method (3) to Use a TaBSi Compound Target]
Sputtering gas: mixed gas of Ar and $O_2$ ($O_2$ gas concentration of from 3 to 80 vol %, preferably from 5 to 30 vol %, more preferably from 8 to 15 vol %)
Gas pressure: $1.0 \times 10^{-1}$ Pa to $10 \times 10^{-1}$ Pa, preferably from $1.0 \times 10^{-1}$ Pa to $5 \times 10^{-1}$ Pa, more preferably from $1.0 \times 10^{-1}$ Pa to $3 \times 10^{-1}$ Pa
Applied power: from 30 to 1,000 W, preferably from 50 to 750 W, more preferably from 80 to 500 W
Film forming rate: from 2.0 to 50 nm/sec, preferably from 2.5 to 35 nm/sec, more preferably from 5 to 25 nm/sec.

The formation of the low reflective layer (TaBSiON) by the above-exemplified methods may be specifically carried out under the following film forming conditions.

[Method (2) to Use a TaB Compound Target and a Si Target]
Sputtering gas: mixed gas of Ar, $O_2$ and $N_2$ ($O_2$ gas concentration and $N_2$ gas concentration being from 5 to 30 vol % and from 5 to 30 vol %, respectively, $O_2$ gas concentration and $N_2$ gas concentration being preferably from 6 to 25 vol % and from 6 to 25 vol %, respectively, and $O_2$ gas concentration and $N_2$ gas concentration being more preferably from 10 to 20 vol % and from 15 to 25 vol %, respectively)
Gas pressure: $1.0 \times 10^{-2}$ Pa to $10 \times 10^{-2}$ Pa, preferably from $1.0 \times 10^{-2}$ Pa to $5 \times 10^{-2}$ Pa, more preferably from $1.0 \times 10^{-2}$ Pa to $3 \times 10^{-2}$ Pa
Applied power (for each target): from 30 to 1,000 W, preferably from 50 to 750 W, more preferably from 80 to 500 W
Film forming rate: from 2.0 to 50 nm/sec, preferably from 2.5 to 35 nm/sec, more preferably from 5 to 25 nm/sec.

[Method (3) to Use a TaBSi Compound Target]
Sputtering gas: mixed gas of Ar, $O_2$ and $N_2$ ($O_2$ gas concentration and $N_2$ gas concentration being from 5 to 30 vol % and from 5 to 30 vol %, respectively, $O_2$ gas concentration and $N_2$ gas concentration being preferably from 6 to 25 vol % and from 6 to 25 vol %, respectively, and $O_2$ gas concentration and $N_2$ gas concentration being more preferably from 10 to 20 vol % and from 15 to 25 vol %, respectively)

Gas pressure: $1.0 \times 10^{-2}$ Pa to $10 \times 10^{-2}$ Pa, preferably from $1.0 \times 10^{-2}$ Pa to $5 \times 10^{-2}$ Pa, more preferably from $1.0 \times 10^{-2}$ Pa to $3 \times 10^{-2}$ Pa Applied power: from 30 to 1,000 W, preferably from 50 to 750 W, more preferably from 80 to 500 W Film forming rate: from 2.0 to 50 nm/sec, preferably from 2.5 to 35 nm/sec, more preferably from 5 to 25 nm/sec.

Here, the reason as to why it is preferred to form a low reflective layer 16 on the absorber layer 15 as in the EUV mask blank 1' shown in FIG. 2, is that the wavelength of the inspection light for a pattern is different from the wavelength of EUV light. Therefore, in a case where EUV light (in the vicinity of 13.5 nm) is used as the inspection light for a pattern, it is considered unnecessary to form a low reflective layer 16 on the absorber layer 15. The wavelength of the inspection light tends to shift toward a low wavelength side as the size of a pattern becomes small, and in future, it is considered to be shifted to 193 nm or further to 13.5 nm. In the case where the wavelength of the inspection light is 13.5 nm, it is considered unnecessary to form a low reflective layer 16 on the absorber layer 15.

The EUV mask blank of the present invention may have a functional film known in the field of EUV mask blank, in addition to the reflective layer 12, the intermediate layer 13, the protective layer 14, the absorber layer 15 and the low reflective layer 16. A specific example of such a functional film may, for example, be a high dielectric constant coating formed on the rear side of the substrate to promote the electrostatic chucking of the substrate, as disclosed in e.g. JP-A-2003-501823. Here, in the substrate shown in FIG. 1, the rear side of the substrate means the surface on the opposite side to the side where the reflective layer 12 is formed. For the high dielectric constant coating to be formed on the rear side of the substrate for such a purpose, the electrical conductivity and the thickness of the constituting material are selected so that the sheet resistance will be at most $100\Omega/\square$. The constituting material of the high dielectric constant coating may be selected widely from those disclosed in known literatures. For example, a high dielectric constant coating disclosed in JP-A-2003-501823, specifically a coating selected from a group of consisting of silicon, TiN, molybdenum, chromium and TaSi may be applied. The thickness of the high dielectric constant coating may, for example, be from 10 to 1,000 nm.

The high dielectric constant coating may be formed by means of a sputtering method, such as a magnetron sputtering method or an ion beam sputtering method, a CVD method, a vacuum vapor deposition method or an electroplating method.

Further, the present invention provides, in addition to the above-described reflective film-equipped substrate and EUV mask blank, an EUV mask having a pattern formed on the EUV mask blank.

The EUV mask of the present invention may be produced by patterning at least the absorber layer of the EUV mask blank of the present invention (in a case where a low reflective layer is formed on the absorber layer, the absorber layer and the low reflective layer). The method for patterning the absorber layer (in a case where a low reflective layer is formed on the absorber layer, the absorber layer and the low reflective layer), is not particularly limited. For example, a method may be employed wherein a resist is applied on the absorber layer (in a case where a low reflective layer is formed on the absorber layer, the absorber layer and the low reflective layer) to form a resist pattern, and by using it as a mask, the absorber layer (in a case where a low reflective layer is formed on the absorber layer, the absorber layer and the low reflective layer) is subjected to etching. The material for the resist, or the drawing method for the resist pattern may suitably be selected in consideration of e.g. the material of the absorber layer (in a case where a low reflective layer is formed on the absorber layer, the absorber layer and the low reflective layer). Also, the method for etching the absorber layer (in a case where a low reflective layer is formed on the absorber layer, the absorber layer and the low reflective layer) is not particularly limited, and dry etching, such as reactive ion etching, or wet etching may be employed. After patterning the absorber layer (in a case where a low reflective layer is formed on the absorber layer, the absorber layer and the low reflective layer), the resist is removed by a remover liquid to obtain the EUV mask of the present invention.

When producing a semiconductor integrated circuit using the EUV mask according to the present invention, the present invention may be applied to a process for producing a semiconductor integrated circuit by means of a photolithography method using EUV light as the light source for exposure. Specifically, a substrate, such as a silicon wafer, coated with a resist is disposed on a stage, and the above EUV mask is set on a reflective exposure apparatus combined with a reflective mirror. And, EUV light from a light source is applied to the EUV mask via the reflective mirror to have the EUV light reflected by the EUV mask and is applied to the substrate coated with the resist. By such a pattern transfer step, a circuit pattern is transferred to the substrate. The substrate having a circuit pattern transferred thereto is subjected to etching of sensitized or non-sensitized portions by development, followed by peeling of the resist. A semiconductor integrated circuit is produced by repeating such a process.

EXAMPLES

Now, the present invention will be described in further detail with reference to Examples.

Example 1

In this Example, a mask blank 1' as shown in FIG. 2 was prepared.

As a substrate 11 for film formation, a $SiO_2$—$TiO_2$ type glass substrate (size: 6 inches (152.4 mm) square, thickness: 6.3 mm) was used. The thermal expansion coefficient of this glass substrate is $0.2 \times 10^{-7}/°$ C., the Young's modulus is 67 GPa, the Poisson ratio is 0.17, and the specific rigidity is $3.07 \times 10^7$ m$^2$/s$^2$. This glass substrate was polished to form a smooth surface having a surface roughness rms of at most 0.15 nm and a planarity of at most 100 nm.

On the rear surface side of the substrate 11, a Cr film having a thickness of 100 nm was formed by a magnetron sputtering method to provide a high dielectric constant coating (not shown in the drawings) having a sheet resistance of $100\Omega/\square$.

By using the formed Cr film, the substrate 11 (size: 6 inches (152.4 mm) square, thickness: 6.3 mm) was fixed to a usual electrostatic chuck of a flat plate shape, and on the surface of the substrate 11, a Mo film and then a Si film were alternately formed by means of an ion beam sputtering method for 50 cycles to form a Mo/Si multilayer reflective film (reflective layer 12) having a total thickness of 340 nm ((2.3 nm+4.5 nm)×50). Here, the uppermost layer of the multilayer reflective film 12 is a Si film.

The film forming conditions for the Mo film and the Si film are as follows.

[Film Forming Conditions for Mo Film]
Target: Mo target
Sputtering gas: Ar gas (gas pressure: 0.02 Pa)
Voltage: 700 V Film forming rate: 0.064 nm/sec
Film thickness: 2.3 nm
[Film Forming Conditions for Si Film]
 Target: Si target (boron-doped)
 Sputtering gas: Ar gas (gas pressure: 0.02 Pa)
 Voltage: 700 V
 Film forming rate: 0.077 nm/sec
 Film thickness: 4.5 nm Then, the Si film surface as the uppermost layer of the Mo/Si multilayer reflective film was exposed, at room temperature, to the atmospheric air (having an oxygen concentration of 21 vol %) as the oxygen-containing atmosphere, and then, an Ru layer was formed as a protective layer 14 by means of an ion beam sputtering method. The exposure amount of oxygen when the Si film surface was exposed to the oxygen-containing atmosphere is 760 (Torr)×0.21×600 (s)=9.6×10$^4$ Torr·s=9.6×10$^{10}$ L.

The conditions for forming the protective layer 14 are as follows.
 Target: Ru target
 Sputtering gas: Ar gas (gas pressure: 0.02 Pa)
 Voltage: 700 V
 Film forming rate: 0.052 nm/sec
 Film thickness: 2.5 nm Then, on the protective layer 14, a TaBSiN layer is formed as an absorber layer 15 by means of a magnetron sputtering method.

The film forming conditions for the TaBSiN layer are as follows.
[Film Forming Conditions for TaBSiN Layer]
 Target: TaBSi compound target (compositional ratio: Ta 80 at %, B 10 at %, Si 10 at %).
 Sputtering gas: mixed gas of Ar and N$_2$ (Ar: 86 vol %, N$_2$: 14 vol %, gas pressure: 0.3 Pa)
 Applied power: 150 W
 Film forming rate: 0.12 nm/sec
 Film thickness: 60 nm Then, on the absorber layer 15, a TaBSiON layer is formed as a low reflective layer 16 by means of a magnetron sputtering method, to obtain a mask blank 1' as shown in FIG. 2.

The film forming conditions for the TaBSiON film are as follows.
[Film Forming Conditions for TaBSiON Layer]
 Target: TaBSi target (compositional ratio: Ta 80 at %, B 10 at %, Si 10 at %)
 Sputtering gas: mixed gas of Ar, N$_2$ and O$_2$ (Ar: 60 vol %, N$_2$: 20 vol %, O$_2$: 20 vol %, gas pressure: 0.3 Pa)
 Applied power: 150 W
 Film forming rate: 0.18 nm/sec
 Film thickness: 10 nm With respect to the mask blank obtained by the above procedure, the following evaluations are carried out.

(1) Film Composition

With respect to a sample formed up to the protective layer 14 by the above-described procedure, by measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), it was confirmed that an intermediate layer 13 was formed between the protective layer 14 and the Si layer as the uppermost layer of the Mo/Si multilayer reflective film. The composition of the intermediate layer 13 was such that oxygen was 5 at %, and Si was 95 at %. Further, the thickness of the intermediate layer 13 was 1 nm.

(2) Surface Roughness

With respect to a sample formed up to the protective layer 14 by the above-described procedure, the surface roughness of the protective layer 14 was confirmed by means of an Atomic Force Microscope (No. SPI3800, manufactured by Seiko Instruments Inc.) in accordance with JIS-B0601 (1994). The surface roughness rms of the protective layer 14 was 0.15 nm.

(3) Cleaning Durability

With respect to a sample formed up to the protective layer 14 by the above-described procedure, the surface of the protective layer 14 was treated by spin cleaning with ozone water for a total of 300 seconds. Before and after this treatment, the EUV reflectivity was measured by means of an EUV reflectivity meter (MBR (product name), manufactured by AIXUV) by applying EUV light (wavelength: 13.5 nm) to the surface of the protective layer 14. Deterioration in the EUV reflectivity as between before and after this treatment was 0.4%, which showed that a good result was obtained.

(4) Reflection Properties (Evaluation of Contrast)

With respect to a sample formed up to the protective layer 14 by the above-described procedure, the reflectivity of a pattern inspection light (wavelength: 257 nm) at the surface of the protective layer 14 is measured by means of a spectrophotometer. Further, with respect to a sample formed up to the low reflective layer 16, the reflectivity of the pattern inspection light at the surface of the low reflective layer 16 is measured. As the results, the reflectivity at the surface of the protective layer 14 is 60.0%, and the reflectivity at the surface of the low reflective layer 16 is 6.9%. The contrast is obtained by using these results and the above-mentioned formula and is found to be 79.4%.

With respect to the obtainable EUV mask blank 1', the surface of the low reflective layer 16 is irradiated with EUV light (wavelength: 13.5 nm), whereby the reflectivity of EUV light is measured. As a result, the reflectivity of EUV light is 0.4%, whereby it is confirmed that the EUV absorption property is excellent.

(5) Etching Property

The etching property is evaluated by the following method instead of an evaluation by using an EUV mask blank prepared by the above-described procedure.

On a sample table (4 inches quartz substrate) of an RF plasma etching apparatus, a Si chip (10 mm×30 mm) having a Ru film or a TaBSiN film formed by the following method, is set as a sample. In this state, the Ru film or the TaNBSiN film of the Si chip set on the sample table is subjected to plasma RF etching under the following conditions.
 Bias RF: 50 W
 Etching time: 120 sec
 Trigger pressure: 3 Pa
 Etching pressure: 1 Pa
 Etching gas: Cl$_2$/Ar
 Gas flow rate (Cl$_2$/Ar): 20/80 sccm
 Electrode-substrate distance: 55 mm Film formation of the Ru film is carried out by an ion beam sputtering method under the following film forming conditions.
[Film Forming Conditions for Ru Film]
 Target: Ru target
 Sputtering gas: Ar gas (gas pressure: 2 mTorr, flow rate: 15 sccm)
 Output power: 150 W
 Film forming rate: 0.023 nm/sec
 Film thickness: 2.5 nm The TaBSiN film is formed by means of a magnetron sputtering method by simultaneously discharging a TaB target and a Si target in a nitrogen atmosphere. Here, the film formation is carried out under the following three conditions.
[Film Forming Condition (1) for TaBSiN Film]
  Target: TaB target (compositional ratio: Ta 80 at %, B 20 at %), Si target
  Sputtering gas: mixed gas of Ar and $N_2$ (Ar: 86 vol %, $N_2$: 14 vol %, gas pressure: 2 mTorr)
  Output power: 150 W (TaB target), 30 W (Si target)
  Film forming rate: 0.13 nm/sec
  Film thickness: 60 nm
[Film Forming Condition (2) for TaBSiN Film]
  Target: TaB target (compositional ratio: Ta 80 at %, B 20 at %), Si target
  Sputtering gas: Ar gas, $N_2$ gas (Ar: 86 vol %, $N_2$: 14 vol %, gas pressure: 2 mTorr)
  Output power: 150 W (TaB target), 50 W (Si target)
  Film forming rate: 0.12 nm/sec
  Film thickness: 60 nm
[Film Forming Condition (3) for TaBSiN Film]
  Target: TaB target (compositional ratio: Ta 80 at %, B 20 at %), Si target
  Sputtering gas: Ar gas, $N_2$ gas (Ar: 86 vol %, $N_2$: 14 vol %, gas pressure: 2 mTorr, flow rate: 13 sccm (Ar), 2 sccm ($N_2$))
  Output power: 150 W (TaB target), 100 W (Si target)
  Film forming rate: 0.11 nm/sec
  Film thickness: 60 nm With respect to the Ru film and the TaBSiN films (1) to (3) formed under the above conditions, etching rates are obtained, and the etching selectivity is obtained by using the following formula (3).

$$\text{Etching selectivity} = (\text{etching rate of TaBSiN film})/(\text{etching rate of Ru film}) \quad (3)$$

The etching selectivity to the protective layer 13 is preferably at least 10. The etching selectivity of each of the TaBSiN film (1) to (3) is as follows, and each has a sufficient selectivity.
  TaBSiN film (1): 10.0
  TaBSiN film (2): 12.3
  TaBSiN film (3): 13.9

Example 2

Example 2 was carried out in the same procedure as in Example 1 except that a Si film as the uppermost layer of the Mo/Si multilayer reflective film was exposed to an oxygen-containing atmosphere under the following conditions.
[Exposure Conditions] (During RF Discharge, an Exposure Gas and a Carrier Gas were Supplied)
  Carrier gas: Ar gas, flow rate: 17 sccm
  Exposure gas: oxygen gas, flow rate: 50 sccm
  Oxygen gas pressure: 0.2 mTorr ($2.6 \times 10^{-2}$ Pa)
  Atmosphere pressure: 0.3 mTorr ($3.5 \times 10^{-2}$ Pa)
  Exposure time: 600 sec
  Exposure temperature: 20° C.
  Exposure amount: $1.2 \times 10^5$ L (1 L (Langmuir)=$1 \times 10^{-6}$ Torr·s)

With respect to the mask blank obtained in the above procedure, the following evaluations were carried out.
(1) Film Composition
  With respect to a sample formed up to the protective layer 14 by the above-described procedure, by measuring the composition in the depth direction from the surface of the protective layer 14 to the reflective layer (Mo/Si multilayer reflective film) 12 by means of the X-ray Photoelectron Spectrometer (Quantera SXM, manufactured by ULVAC-PHI, Inc.), it was confirmed that an intermediate layer 13 was formed between the protective layer 14 and the Si film as the uppermost layer of the Mo/Si multilayer reflective film. The composition of the intermediate layer 13 was such that oxygen was 3 at %, and Si was 97 at %. Further, the thickness of the intermediate layer 13 was 1 nm.
(2) Surface Roughness
  With respect to a sample formed up to the protective layer 14 by the above-described procedure, the surface roughness of the protective layer 14 was confirmed by means of the Atomic Force Microscope (No. SPI3800, manufactured by Seiko Instruments Inc.) in accordance with JIS-B0601 (1994). The surface roughness rms of the protective layer 14 was 0.15 nm.
(3) Cleaning Durability
  With respect to a sample formed up to the protective layer 14 by the above-described procedure, the surface of the protective layer 14 was treated by spin cleaning with ozone water for a total of 300 seconds. Before and after this treatment, the EUV reflectivity was measured by means of the EUV reflectivity meter (MBR (product name), manufactured by AIXUV) by applying EUV light (wavelength: 13.5 nm) to the surface of the protective layer 14. Deterioration in the EUV reflectivity as between before and after this treatment was 0.5%.

Example 3

Example 3 was carried out in the same procedure as in Example 2 except that at the time of exposing the Si film as the uppermost layer of the Mo/Si multilayer reflective film to the oxygen-containing atmosphere, no RF discharge was carried out, and the Si film surface was irradiated with an ultraviolet ray in accordance with the following conditions.
[Exposure Conditions] (Supply of Exposure Gas and Carrier Gas without Carrying Out RF Discharge)
  Carrier gas: Ar gas, flow rate: 17 sccm
  Exposure gas: oxygen gas, flow rate: 50 sccm
  Oxygen gas partial pressure: 0.2 mTorr ($2.6 \times 10^{-2}$ Pa)
  Atmosphere pressure: 0.3 mTorr ($3.5 \text{ Torr} \times 10^{-2}$ Pa)
  Atmosphere temperature: 20° C.
  Exposure time: 600 sec
  Exposure amount: $1.2 \times 10^5$ L (1 L (Langmuir)=$1 \times 10^{-6}$ Torr·s)
  Ultraviolet irradiation light source: argon excimer lamp
  Ultraviolet wavelength: 126 nm
  Distance between lamp window (magnesium fluoride) and substrate: 5 cm With respect to a mask blank obtained in the above procedure, the following evaluations were carried out.
(1) Film Composition
  With respect to a sample formed up to the protective layer 14 by the above-described procedure, by measuring the composition in the depth direction from the surface of the protective layer 14 to the reflective layer (Mo/Si multilayer reflective film) 12 by means of the X-ray Photoelectron Spectrometer (Quantera SXM, manufactured by ULVAC-PHI, Inc.), it was confirmed that an intermediate layer 13 was formed between the protective layer 14 and the Si film as the uppermost layer of the Mo/Si multilayer reflective film. The composition of the intermediate layer 13 was such that oxygen was 3 at %, and Si was 97 at %. Further, the thickness of the intermediate layer 13 was 1 nm.
(2) Surface Roughness
  With respect to a sample formed up to the protective layer 14 by the above-described procedure, the surface roughness of the protective layer 14 was confirmed by means of the Atomic Force Microscope (No. SPI3800, manufactured by Seiko Instruments Inc.) in accordance with JIS-B0601 (1994). The surface roughness rms of the protective layer 14 was 0.15 nm.

(3) Cleaning Durability

With respect to a sample formed up to the protective layer 14 by the above-described procedure, the surface of the protective layer 14 was treated by spin cleaning with ozone water for a total of 300 seconds. Before and after this treatment, the EUV reflectivity was measured by means of the EUV reflectivity meter (MBR (product name), manufactured by AIXUV) by applying EUV light (wavelength: 13.5 nm) to the surface of the protective layer 14. Deterioration in the EUV reflectivity as between before and after this treatment was 0.5%.

Comparative Example 1

Comparative Example 1 was carried out in the same procedure as in Example 1 except that after the formation of the reflective layer (Mo/Si multilayer reflective film) 12, a protective layer 15 was formed without exposing the Si film as the uppermost layer of the Mo/Si multilayer reflective film to an oxygen-containing atmosphere.

With respect to the mask blank obtained in the above procedure, the following evaluations were carried out.

(1) Film Composition

With respect to a sample formed up to the protective layer 14 by the above-described procedure, by measuring the composition in the depth direction from the surface of the protective layer 14 to the reflective layer (Mo/Si multilayer reflective film) 12 by means of the X-ray Photoelectron Spectrometer (Quantera SXM, manufactured by ULVAC-PHI, Inc.), formation of an intermediate layer 13 was not observed between the protective layer 14 and the Si film as the uppermost layer of the Mo/Si multilayer reflective film, and the oxygen content in the laminate of the Si film and the protective layer 14 was 0%.

(2) Surface Roughness

With respect to a sample formed up to the protective layer 14 by the above-described procedure, the surface roughness of the protective layer 14 was confirmed by means of the Atomic Force Microscope (No. SPI3800, manufactured by Seiko Instruments Inc.) in accordance with JIS-B0601 (1994). The surface roughness rms of the protective layer 14 was 0.15 nm.

(3) Cleaning Durability

With respect to a sample formed up to the protective layer 14 by the above-described procedure, the surface of the protective layer 14 was treated by spin cleaning with ozone water for a total of 300 seconds. Before and after this treatment, the EUV reflectivity was measured by means of the EUV reflectivity meter (MBR (product name), manufactured by AIXUV) by applying EUV light (wavelength: 13.5 nm) to the surface of the protective layer 14. Deterioration in the EUV reflectivity as between before and after this treatment was 1%.

From this result, it was confirmed that the mask blank in Comparative Example 1 was inferior in the cleaning durability as compared with the mask blanks in Examples 1 and 2.

Example 4

In this Example, a multilayer mirror 1 for EUVL as shown in FIG. 4 was prepared.

As a substrate 11 for film formation, a $SiO_2$—$TiO_2$ type glass substrate was used. The thermal expansion coefficient of this glass substrate is $0.2 \times 10^{-7}/°$ C., the Young's modulus is 67 GPa, the Poisson ratio is 0.17, and the specific rigidity is $3.07 \times 10^7$ $m^2/s^2$. This glass substrate was polished to form a smooth surface having a surface roughness rms of at most 0.15 nm.

On the surface of such a substrate 11, a Mo film and a Si film were alternately deposited by means of an ion beam sputtering method in 50 cycles to form a Mo/Si multilayer reflective film (reflective layer 12) having a total thickness of 340 nm ($(2.3$ nm$+4.5$ nm$)_{x50}$). Here, the uppermost layer of the multilayer reflective film 12 is a Si film.

The film forming conditions for the Mo film and the Si film are as follows.

[Film Forming Conditions for Mo Layer]
Target: Mo target
Sputtering gas: Ar gas (gas pressure: 0.02 Pa)
Voltage: 700 V
Film forming rate: 0.064 nm/sec
Film thickness: 2.3 nm

[Film Forming Conditions for Si Film]
Target: Si target (boron-doped)
Sputtering gas: Ar gas (gas pressure: 0.02 Pa)
Voltage: 700 V
Film forming rate: 0.077 nm/sec
Film thickness: 4.5 nm Then, the Si film surface as the uppermost layer of the Mo/Si multilayer reflective film was exposed, at room temperature, to the atmospheric air (having an oxygen concentration of 21 vol %) as the oxygen-containing atmosphere, and then, an Ru layer as the protective layer 14 was formed by means of an ion beam sputtering method. The exposure amount of oxygen when the Si film surface was exposed to the oxygen-containing atmosphere was 760 (Torr)$\times 0.21 \times 600$ (s)$=9.6 \times 10^4$ Torr·s$=9.6 \times 10^{10}$ L.

The forming conditions for the protective layer 14 were as follows.
Target: Ru target
Sputtering gas: Ar gas (gas pressure: 0.02 Pa)
Voltage: 700 V
Film forming rate: 0.052 nm/sec
Film thickness: 2.5 nm With respect to the multilayer mirror for EUVL obtained in the above-described procedure, the following evaluations were carried out.

(1) Film Composition

By measuring the composition in the depth direction from the surface of the protective layer 14 to the reflective layer (Mo/Si multilayer reflective film) 12 by means of the X-ray Photoelectron Spectrometer (Quantera SXM, manufactured by ULVAC-PHI, Inc.), it was confirmed that an intermediate layer 13 was formed between the protective layer 14 and the Si film as the uppermost layer of the Mo/Si multilayer reflective film. The composition of the intermediate layer 13 was such that oxygen was 5 at %, and Si was 95 at %. Further, the thickness of the intermediate layer 13 was 1 nm.

(2) Surface Roughness

The surface roughness of the protective layer 14 was confirmed by means of the Atomic Force Microscope (No. SPI3800, manufactured by Seiko Instruments Inc.) in accordance with JIS-B0601 (1994). The surface roughness rms of the protective layer 14 was 0.15 nm.

(3) Cleaning Durability

The surface of the protective layer 14 was treated by spin cleaning with ozone water for a total of 300 seconds. Before and after this treatment, the EUV reflectivity was measured by means of the EUV reflectivity meter by applying EUV light (wavelength: 13.5 nm) to the surface of the protective layer 14. Deterioration in the EUV reflectivity as between before and after this treatment was 0.4%.

Example 5

Example 5 was carried out in the same procedure as in Example 4 except that a Si film as the uppermost layer of a Mo/Si multilayer reflective film was exposed to an oxygen-containing atmosphere under the following conditions.
[Exposure Conditions]
Carrier gas: Ar gas, flow rate: 17 sccm
Exposure gas: oxygen gas, flow rate: 50 sccm
Oxygen gas pressure: 0.2 mTorr ($2.6 \times 10^{-2}$ Pa)
Atmosphere pressure: 0.3 mTorr ($3.5 \times 10^{-2}$ Pa)
Exposure time: 600 sec
Exposure temperature: 20° C.
Exposure amount: $1.2 \times 10^5$ L (1 L (Langmuir)=$1 \times 10^{-6}$ Torr·s)

With respect to the multilayer mirror for EUVL obtained in the above-described procedure, the following evaluations were carried out.
(1) Film Composition
By measuring the composition in the depth direction from the surface of the protective layer 14 to the reflective layer (Mo/Si multilayer reflective film) 12 by means of the X-ray Photoelectron Spectrometer (Quantera SXM, manufactured by ULVAC-PHI, Inc.), it was confirmed that an intermediate layer 13 was formed between the protective layer 14 and the Si film as the uppermost layer of the Mo/Si multilayer reflective film. The composition of the intermediate layer 13 was such that oxygen was 3 at %, and Si was 97 at %. Further, the thickness of the intermediate layer 13 was 1 nm.
(2) Surface Roughness
The surface roughness of the protective layer 14 was confirmed by means of the Atomic Force Microscope (No. SPI3800, manufactured by Seiko Instruments Inc.) in accordance with JIS-B0601 (1994). The surface roughness rms of the protective layer 14 was 0.15 nm.
(3) Cleaning Durability
The surface of the protective layer 14 was treated by spin cleaning with ozone water for a total of 300 seconds. Before and after this treatment, the EUV reflectivity was measured by means of the EUV reflectivity meter (MBR (product name) manufactured by AIXUV) by applying EUV light (wavelength: 13.5 nm) to the surface of the protective layer 14. Deterioration in the EUV reflectivity as between before and after this treatment was 0.5%.

Comparative Example 2

Comparative Example 2 was carried out in the same procedure as in Example 4 except that after the formation of the reflective layer (Mo/Si multilayer reflective film) 12, a protective layer 14 was formed without exposing the Si film as the uppermost layer of the Mo/Si multilayer reflective film to an oxygen-containing atmosphere.

With respect to the multilayer mirror for EUVL obtained in the above-described procedure, the following evaluations were carried out.
(1) Film Composition
By measuring the composition in the depth direction from the surface of the protective layer 14 to the reflective layer (Mo/Si multilayer reflective film) 12 by means of the X-ray Photoelectron Spectrometer (Quantera SXM, manufactured by ULVAC-PHI, Inc.), formation of an intermediate layer 13 was not observed between the protective layer 14 and the Si film as the uppermost layer of the Mo/Si multilayer reflective film, and the oxygen content in the laminate of the Si layer and the protective layer 14 was 0%.
(2) Surface Roughness
The surface roughness of the protective layer 14 was confirmed by means of the Atomic Force Microscope (No. SPI3800, manufactured by Seiko Instruments Inc.) in accordance with JIS-B0601 (1994). The surface roughness rms of the protective layer 14 was 0.15 nm.
(3) Cleaning Durability
The surface of the protective layer 14 was treated by spin cleaning with ozone water for a total of 300 seconds. Before and after this treatment, the EUV reflectivity was measured by means of the EUV reflectivity meter by applying EUV light (wavelength: 13.5 nm) to the surface of the protective layer 14. Deterioration in the EUV reflectivity as between before and after this treatment was 1%.

From this result, it was confirmed that the multilayer mirror for EUVL in Comparative Example 2 was inferior in the cleaning durability as compared with the multilayer mirrors for EUVL in Examples 4 and 5.

INDUSTRIAL APPLICABILITY

In accordance with the reflective layer-equipped substrate of the present invention, and the EUV mask blank and the EUV mirror employing the reflective layer-equipped substrate of the present invention, deterioration in the EUV light reflectivity due to oxidation of the Ru protective layer is prevented, whereby it becomes unnecessary to change the exposure conditions in a half way, and it is possible to prolong the useful life of a photomask.

Further, an EUV mask prepared by using the EUV mask blank of the present invention is a highly reliable EUV mask with little change with time of the EUV light reflectivity during the EUV exposure and is useful for the production of a semiconductor integrated circuit having a fine pattern.

This application is a continuation of PCT Application No. PCT/JP2010/071738, filed on Dec. 3, 2010, which is based upon and claims the benefit of priority from Japanese Patent Application No. 2009-276178 filed on Dec. 4, 2009. The contents of those applications are incorporated herein by reference in its entirety.

REFERENCE SYMBOLS 1 and 1': EUV mask blank
11: Substrate
12: Reflective layer
13: Intermediate layer
14: Protective layer
15: Absorber layer
16: Low reflective layer
21: EUV mirror

What is claimed is:
1. A reflective layer-equipped substrate for EUV lithography comprising:
a substrate;
a reflective layer which reflects EUV light and is formed on the substrate;
an intermediate layer formed on the reflective layer; and
a protective layer which protects the reflective layer and is formed on the intermediate layer,
wherein the reflective layer comprises a Mo/Si multilayer reflective film, the protective layer comprises a Ru layer or a Ru compound layer, and the intermediate layer includes oxygen in an amount of from 0.5 to 20 at % and Si in an amount of from 80 to 99.5 at %.

2. The reflective layer-equipped substrate for EUV lithography according to claim 1, wherein the reflective layer includes a Si film forming an uppermost layer of the Mo/Si multilayer reflective film, and the intermediate layer is formed on a surface of the Si film forming the uppermost layer of the Mo/Si multilayer reflective film.

3. The reflective layer-equipped substrate for EUV lithography according to claim 1, wherein the intermediate layer has a thickness in a range of from 0.2 to 2.5 nm.

4. The reflective layer-equipped substrate for EUV lithography according to claim 1, wherein the protective layer has a surface having a surface roughness of at most 0.5 nm in rms.

5. The reflective layer-equipped substrate for EUV lithography according to claim 1, wherein the protective layer has a thickness in a range of from 1 to 10 nm.

6. A reflective mask blank for EUV lithography, comprising:
    a substrate;
    a reflective layer which reflects EUV light and is formed on the substrate;
    an intermediate layer formed on the reflective layer;
    a protective layer which protects the reflective layer and is formed on the intermediate layer; and
    an absorber layer formed on the protective layer,
    wherein the reflective layer comprises a Mo/Si multilayer reflective film, the protective layer comprises a Ru layer or a Ru compound layer, and the intermediate layer includes oxygen in an amount of from 0.5 to 20 at % and Si in an amount of from 80 to 99.5 at %.

7. The reflective mask blank for EUV lithography according to claim 6, wherein the absorber layer is made of a material comprising tantalum as a main component.

8. The reflective mask blank for EUV lithography according to claim 6, wherein the protective layer and the absorber layer have an etching selectivity of at least 10 between the protective layer and the absorber layer for dry etching.

9. The reflective mask blank for EUV lithography according to claim 6, further comprising:
    a low reflective layer for inspection of a mask pattern by an inspection light, wherein the low reflective layer is made of a material comprising tantalum as a main component and is formed on the absorber layer.

10. The reflective mask blank for EUV lithography according to claim 9, wherein the low reflective layer has a contrast of at least 30% between reflected light on a surface of the protective layer and reflected light on a surface of the low reflective layer to a wavelength of light for the inspection of a pattern to be formed in the absorber layer.

11. A reflective mask for EUV lithography obtained by patterning the EUV reflective mask blank as defined in claim 6.

12. A reflective mirror for EUV lithography comprising the reflective layer-equipped substrate for EUV lithography as defined in claim 1.

13. A process for producing a reflective layer-equipped substrate for EUV lithography, comprising:
    forming a multilayer reflective film for reflecting EUV light on a film-forming surface of a substrate;
    exposing a surface of an uppermost layer of the multilayer reflective film to an oxygen-containing atmosphere such that an intermediate layer including oxygen in an amount of from 0.5 to 20 at % and Si in an amount of from 80 to 99.5 at % is formed on the multilayer reflective film; and
    forming on the intermediate layer a protective layer for protecting the multilayer reflective film after the exposing,
    wherein the multilayer reflective film comprises a Mo/Si multilayer reflective film, the protective layer comprises a Ru layer or a Ru compound layer, and the uppermost layer of the Mo/Si multilayer reflective film is a Si film.

14. The process for producing a reflective layer-equipped substrate for EUVL according to claim 13, wherein the oxygen-containing atmosphere has a product of an oxygen partial pressure and an exposure time which is at least $1 \times 10^{-6}$ Torr·s, and the oxygen-containing atmosphere has a temperature in a range of from 0 to 150° C.

15. The process for producing a reflective layer-equipped substrate for EUVL according to claim 13, further comprising maintaining the oxygen-containing atmosphere in a plasma state after the forming of the Mo/Si multilayer reflective film.

16. The process for producing a reflective layer-equipped substrate for EUVL according to claim 13, further comprising:
    applying thermal treatment to the surface of the Si film after the forming of the Mo/Si multilayer reflective film.

17. The process for producing a reflective layer-equipped substrate for EUVL according to claim 13, further comprising:
    irradiating ultraviolet ray upon the surface of the Si film after the forming of the Mo/Si multilayer reflective film.

18. The reflective layer-equipped substrate for EUV lithography according to claim 1, wherein the intermediate layer is formed by exposing a surface of an uppermost layer of the multilayer reflective film to an oxygen-containing atmosphere such that the intermediate layer is formed on the multilayer reflective film, and the uppermost layer of the Mo/Si multilayer reflective film is a Si film.

19. The reflective layer-equipped substrate for EUV lithography according to claim 1, wherein the amount of oxygen in the intermediate layer is in a range of 0.5 to 10 at %.

20. The reflective mask blank for EUV lithography according to claim 6, wherein the intermediate layer is formed by exposing a surface of an uppermost layer of the multilayer reflective film to an oxygen-containing atmosphere such that the intermediate layer is formed on the multilayer reflective film, and the uppermost layer of the Mo/Si multilayer reflective film is a Si film.

* * * * *